(12) United States Patent
Shimokawa et al.

(10) Patent No.: US 6,299,785 B1
(45) Date of Patent: Oct. 9, 2001

(54) ELECTRODE FORMATION PROCESS

(75) Inventors: Tsutomu Shimokawa; Hideaki Masuko; Hiroaki Nemoto, all of Mie; Nobuo Bessho, Kanagawa, all of (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/296,241

(22) Filed: Apr. 22, 1999

(30) Foreign Application Priority Data

Apr. 27, 1998 (JP) .................................................. 10-117554

(51) Int. Cl.$^7$ ........................................................ G02F 1/135
(52) U.S. Cl. .............................. 216/4; 216/20; 216/36; 216/54; 156/237; 430/313; 430/323
(58) Field of Search ........................... 156/230, 235, 156/237, 278, 280, 297, 299, 349, 239, 247, 289, 427, 146, 147; 216/4, 13, 20, 24, 25, 33, 35, 36, 54; 430/313, 317, 318, 321, 323

(56) References Cited

U.S. PATENT DOCUMENTS 5,792,589   8/1998   Udagawa et al. .
5,916,401 * 6/1999   Gannon ................................ 156/240

FOREIGN PATENT DOCUMENTS

| 5-205627 | 8/1993 | (JP) . |
| 5-205632 | 8/1993 | (JP) . |
| 5-205633 | 8/1993 | (JP) . |
| 6-75372 | 3/1994 | (JP) . |
| 6-321619 | 11/1994 | (JP) . |
| 9-142878 | 6/1997 | (JP) . |
| 09-92137 * | 9/1997 | (JP) ................................ H01J/9/02 |

* cited by examiner

Primary Examiner—Randy Gulakowski
Assistant Examiner—Allan Olsen
(74) Attorney, Agent, or Firm—Oblon, Spivak, McClelland, Maier & Neustadt, P.C.

(57) ABSTRACT

A process for the preparation of an electrode, which comprises: (1) transferring a conductive paste layer supported on a base film to a substrate to form the conductive paste layer on the substrate; (2) forming a resist film on the conductive paste layer transferred to the substrate; (3) exposing the resist film through a mask to form a resist pattern latent image; (4) developing the exposed resist film to form a resist pattern; (5) etching exposed portions of the conductive paste layer to form a conductive paste layer pattern corresponding to the resist pattern; and (6) thermosetting the pattern to form a conductive layer pattern.

14 Claims, 2 Drawing Sheets

FIG. 1

(a) 
11 substrate (b) 
22 base film
20 transfer film
21 conductive paste layer
11

(c) 
21
11

(d) 
31 resist film
21
11

(e) 
light Transmitting portion — MA
light shading portion — MB
M exposure mask
31
21
11

ELECTRODE FORMATION PROCESS

FIELD OF THE INVENTION

The present invention relates to a process for forming an electrode made of a conductive layer pattern on a substrate.

More specifically, it relates to a process for forming an electrode constituting electrode wires or protrusion electrodes for printed circuit boards, multi-layer circuit boards, multi-chip modules, LCDs and LSIs, which makes it possible to form a very fine pattern and which can substantially improve workability using a transfer film compared with the process of the prior art.

PRIOR ART

Recently, there has been arising a demand for smaller, finer and higher-density electrode wires and protrusion electrodes for printed circuit boards, multi-layer circuit boards, multi-chip modules, LCDs and LSIs.

As conventional processes for forming such electrodes, there have been known (1) an etching process which comprises forming a metal thin film by sputtering or vapor deposition, coating a resist, exposing and developing the resist film, and forming a metal thin film pattern with an etching solution, (2) a screen printing process which comprises screen-printing a non-photosensitive conductive paste composition on a substrate to form a pattern and heating the pattern, and (3) photolithography which comprises forming a photosensitive conductive paste composition film on a substrate, exposing the film to ultraviolet radiation through a photo mask, developing it to form a pattern on the substrate, and heating the pattern.

However, the above etching process has such problems that a vacuum device is required and that the process throughput is low.

The above screen printing process has such a problem that it has limits in the formation of a pattern of 100 $\mu$m or less in width and cannot achieve satisfactory resolution.

The above photolithography has such problems that the sensitivity of a conductive paste layer in a depth direction is unsatisfactory in forming a pattern as thick as 5 to 20 $\mu$m and that a material with a wide development margin cannot be obtained.

SUMMARY OF THE INVENTION

It is therefore an object of the present invention to provide an electrode formation process which makes it possible to form an electrode, having a very fine pattern which could not be attained by the above etching process, screen printing process and photography and having excellent surface uniformity, by a simple method.

It is another object of the present invention to provide a novel electrode formation process which makes it possible to form an electrode at a higher efficiency than the process of the prior art by a substantially improved workability.

Other objects and advantages of the present invention will become apparent from the following description.

According to the present invention, firstly, the above objects and advantages of the present invention are attained by a process for forming an electrode, which comprises:

(1) transferring a conductive paste layer supported on a base film to a substrate to form the conductive paste layer on the substrate;

(2) forming a resist film on the conductive paste layer transferred to the substrate;

(3) exposing the resist film through a mask to form a resist pattern latent image;

(4) developing the exposed resist film to form a resist pattern;

(5) etching exposed portions of the conductive paste layer to form a conductive paste layer pattern corresponding to the resist pattern; and (6) thermosetting the pattern to form a conductive layer pattern.

DETAILED DESCRIPTION OF THE PREFERRED EMBODIMENT

The above process of the present invention comprises the following steps (1) to (6).

That is, the process of the present invention comprises the steps of (1) transferring a conductive paste layer, (2) forming a resist film, (3) exposing the resist film, (4) developing the resist film, (5) etching a conductive paste layer and (6) thermosetting a conductive paste layer pattern.

Step of Transferring Conductive Paste Layer

The step (1) of the present invention is characterized in that a conductive paste layer constituting a transfer film is transferred to the surface of a substrate.

The transfer film comprises a base film and the conductive paste layer formed on the base film. A protective film layer may be formed on the surface of the conductive paste layer. The detailed constitution of the transfer film will be described later.

One example of the transfer step will be described with reference to FIG. 1. After the protective film layer (not shown), which is used as required, of the transfer film is removed, the transfer film 20 is placed upon a substrate 11 in such a manner that the surface of the conductive paste layer 21 comes into contact with the surface of the substrate 11. After the transfer film 20 is thermally press-bonded to the substrate 11 with a heating roller, the base film 22 is separated and removed from the conductive paste layer 21. Thereby, as shown in FIG. 1(c), the conductive paste layer 21 is transferred to the surface of the substrate 11 and closely adhered to the substrate 11. In this respect, transfer conditions include, for example, a heating roller surface temperature of 80 to 140° C., a heating roll pressure of 1 to 5 kg/cm$^2$, and a heating roller moving speed of 0.1 to 10.0 m/min. The substrate may be preheated at 40 to 120° C., for example.

An antireflection underlayer (not shown) may be formed between the substrate and the transfer film before the conductive paste layer is transferred. The antireflection layer is obtained, for example, by coating and drying a paste containing carbon black. As will be described later, a transfer film having a laminate film consisting of the conductive paste layer and the antireflection layer may be used to transfer the antireflection layer and the conductive paste layer at the same time.

The conductive paste layer comprises a binder in which conductive particles are dispersed.

In the formation process of the present invention, it is preferred that a laminate, consisting of a plurality of conductive paste layers that differ from one another in solubility in an etching solution, be transferred to and formed on the substrate.

Material layer residual portions preferably having a rectangular or nearly rectangular section can be formed due to anisotropy in a depth direction when such a laminate is subjected to etching.

The number (n) of conductive paste layers to form the laminate is generally 2 to 10, preferably 2 to 5.

To form a laminate consisting of an "n" number of conductive paste layers on a substrate, (1) a conductive paste layer (single layer) formed on a base film may be transferred an "n" number of times or (2) a laminate consisting of an n number of conductive paste layers may be transferred. To simplify the transfer step, (2) is preferred.

Step of Forming Resist Film

Figure 1:
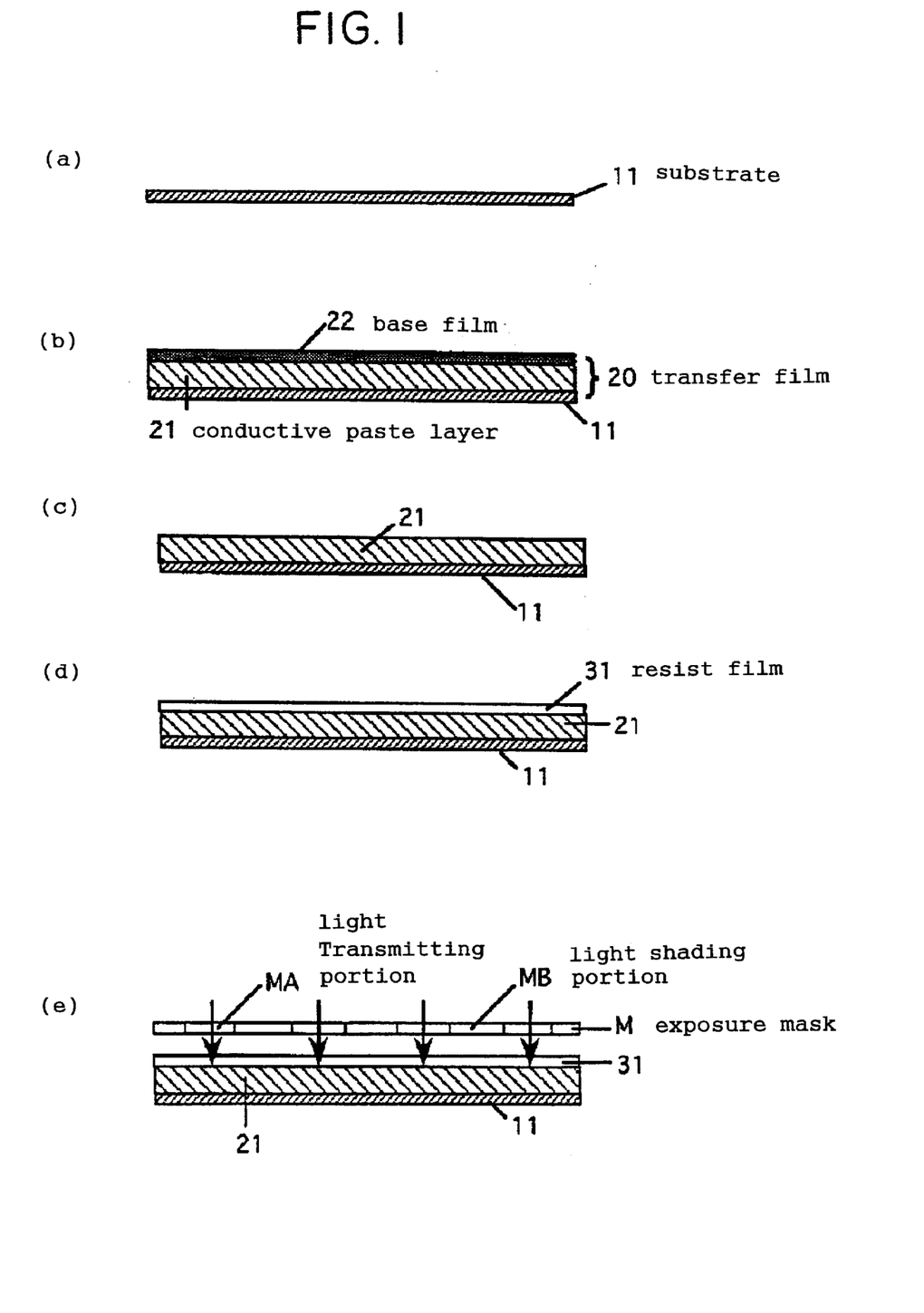
FIG. 1 is a sectional view describing the steps of an electrode formation process according to one embodiment of the present invention in the order they are conducted.

In this step (2), as shown in FIG. 1(d), a resist film 31 is formed on the surface of the transferred conductive paste layer 21. A resist forming this resist film 31 may be either positive or negative. Its composition will be described later.

In the step of forming the resist film 31, the resist film may be formed on an antireflection layer containing an ultraviolet absorber such as dye after the antireflection layer is formed on the transferred conductive paste layer.

The resist film 31 can be formed by coating a resist by screen printing, roll coating, rotary coating, cast coating or other methods and drying the coating film.

Alternatively, the resist film 31 may be formed by transferring a resist composition, formed on the base film, to the surface of the conductive paste layer 21. According to this method, the efficiency of forming the resist film can be improved and the film thickness of the formed conductive pattern can be made uniform.

The thickness of the resist film 31 is generally 0.1 to 40 $\mu$m, preferably 0.5 to 20 $\mu$m.

Step of Exposing Resist Film

In this step (3), as shown in FIG. 1(e), a resist pattern latent image is formed on the surface of the resist film 31 that has been formed on the conductive paste layer 21, by selectively irradiating (exposure) the resist film with radiation such as ultraviolet radiation through an exposure mask M. In the above figure, MA and MB indicate a light transmitting portion and a light shading portion of the exposure mask M, respectively.

The irradiation device used herein is not particularly limited and may be an ultraviolet irradiation device used for the above photolithography or an irradiation device used for producing semiconductors and liquid crystal display devices.

Step of Developing Resist Film

In this step, the exposed resist film is developed to form a resist pattern (latent image).

As for development conditions, the type, composition and concentration of a developing solution, development time, development temperature, development method (for example, immersion, shaking, shower, spray or puddle development) and a developing device may be suitably selected, according to the type of the resist film 31.

Figure 2:
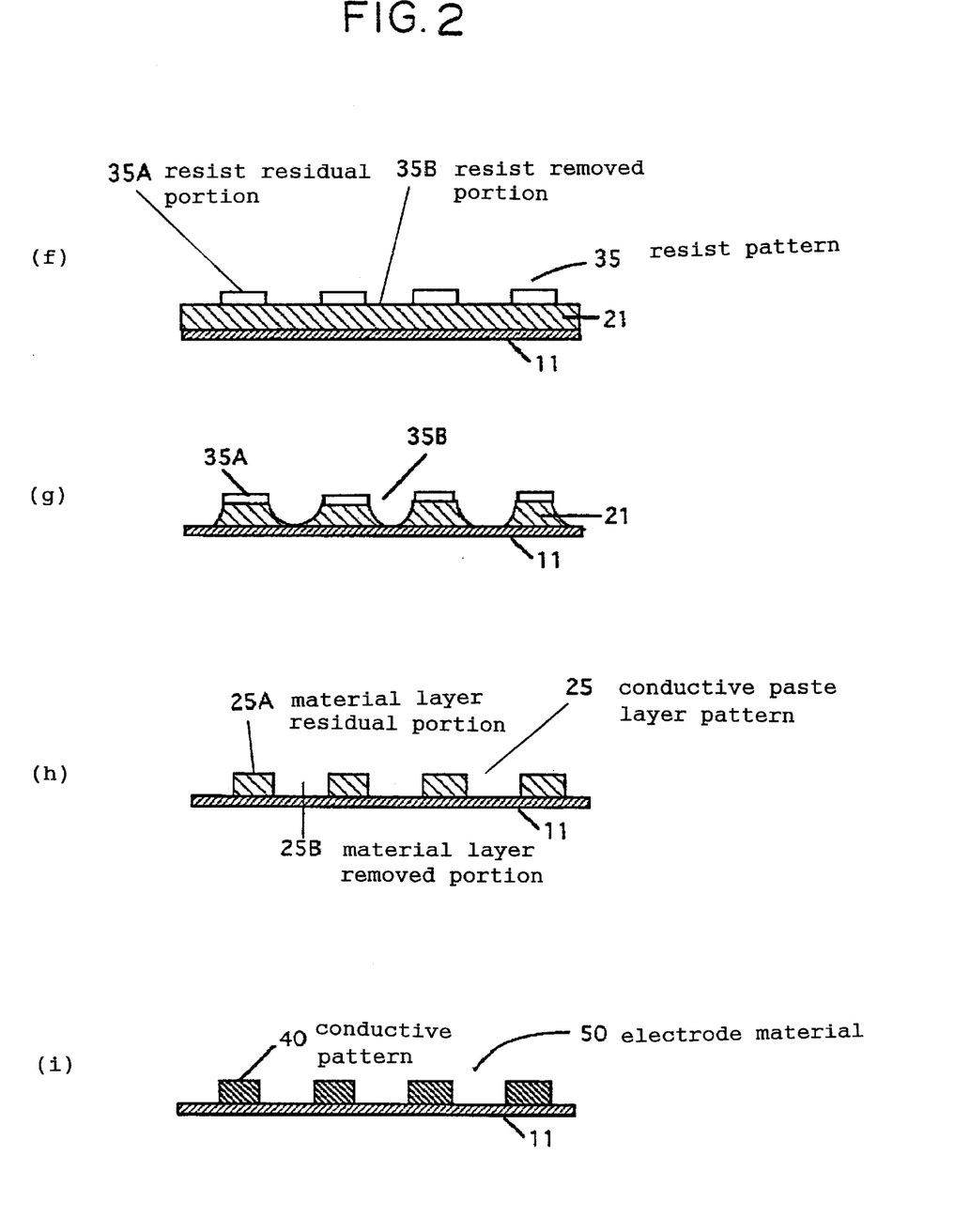
FIG. 2 is a sectional view describing the steps of the formation process according to one embodiment of the present invention following the steps of FIG. 1.

By this development step, as shown in FIG. 2(f), a resist pattern 35 consisting of resist residual portions 35A and resist removed portions 35B. (pattern corresponding to the exposure mask M) is formed.

This resist pattern 35 serves as an etching mask in the following step (etching step), and the material constituting the resist residual portions 35A must have a lower dissolving rate in an etching solution than the material constituting the conductive paste layer 21.

Step of Etching Conductive Paste Layer

In this step (5), the conductive paste layer is etched to form a conductive paste layer pattern corresponding to the resist pattern.

That is, as shown in FIG. 2(g), the portions of the conductive paste layer 21, which correspond to the resist removed portions 35B of the resist pattern 35, are dissolved in an etching solution and selectively removed. FIG. 2(g) shows that the conductive paste layer 21 is being etched.

If etching is further continued, the surface of the substrate is exposed at portions corresponding to the resist removed portions of the conductive paste layer 21, as shown in FIG. 2(h).

As for etching conditions, the type, composition and concentration of the etching solution, treatment time, treatment temperature, treatment method (for example, immersion, shaking, shower, spray or puddle etching) and treatment device may be suitably selected according to the type of the conductive paste layer 21.

By selecting such types of the resist film 31 and the conductive paste layer 21 that the same solution as the developing solution used in the development step can be used as the etching solution, the development step (4) and the etching step (5) can be carried out in succession and production efficiency can be improved by the simplification of the process.

In this respect, the resist residual portions 35A constituting the resist pattern 35 are preferably dissolved gradually during etching and removed completely by the time a conductive paste layer pattern is formed (at the end of etching).

Step of Thermally Curing Conductive Paste Layer

In this step (6), the conductive paste layer pattern is thermoset to form an electrode. Thereby, an organic substance contained in the material layer residual portions is thermoset (thermally crosslinked) to form a metal layer, thereby making it possible to obtain an electrode material 50 comprising a conductive pattern 40 formed on the surface of the substrate as shown in FIG. 2(i).

The thermosetting temperature must be a temperature at which the organic substance contained in the material layer residual portion is thermoset, that is, generally 100 to 800° C., preferably 100 to 500° C. The baking time is generally 10 to 100 minutes.

According to the present invention, there is also provided a process for forming a conductive layer on a substrate (to be referred to as "the second process of the present invention" hereinafter).

That is, according to the present invention, there is provided a process for forming an electrode, which comprising:

(1) transferring a laminate film, which has a resist film and a conductive paste layer laminated and supported on a base film in the order of mention, to a substrate to form the laminate film which has the conductive paste layer and the resist film laminated on the substrate in the order of mention;

(2) exposing the resist film through a mask to form a resist pattern latent image;

(3) developing the exposed resist film to form a resist pattern;

(4) etching exposed portions of the conductive paste layer to form a conductive paste layer pattern corresponding to the resist pattern; and (5) thermosetting the pattern to form a conductive layer pattern.

In the above step (1), there is used a laminate film which has a resist film and a conductive paste layer laminated and supported on a base film in the order of mention. This laminate film is produced by forming the resist film on the base film and then forming the conductive paste layer on the resist film. For example, a roll coater may be used to form the resist film and the conductive paste layer, thereby making it possible to form a laminate film having excellent thickness uniformity on the base film.

The laminate film having the resist film and the conductive paste layer formed on the base film is transferred to the substrate. The transfer conditions may be the same as those of the step of transferring the conductive paste layer. The steps (2), (3), (4) and (5) are carried out with the same operations as in the above steps of exposing the resist film, developing the resist film, etching the conductive paste layer and thermosetting the conductive paste layer.

According to the above process, since the conductive paste layer and the resist film can be transferred to the substrate at a time, production efficiency can be further improved by the simplification of the process.

The process of the present invention is suitably used for the formation of an electrode.

Materials and conditions used in each of the above steps will be described hereunder.

Substrate

The substrate is composed of, for example, a plate material made from an insulating material such as ceramic, alumina, glass, silicon, polycarbonate, polyester, aromatic amide, polyamide imide or polyimide. The surface of the plate material may be subjected to a chemical treatment with a silane coupling agent or other chemicals, a plasma treatment, or a suitable pretreatment such as a thin-film-formation treatment by ion plating, sputtering, vapor phase reaction or vacuum vapor deposition.

Transfer Film

The transfer film used in the formation process of the present invention consists of a base film and a conductive paste layer formed on the base film. A protective film layer may be formed on the surface of the conductive paste layer.

(1) Base Film

The base film constituting the transfer film is preferably a resin film having heat resistance, solvent resistance and flexibility. The flexibility of the base film enables the base film to be coated with a paste composition by a roll coater so that the conductive paste layer can be kept in the form of a roll and supplied. The resin forming the base film is selected from, for example, polyethylene terephthalate, polyesters, polyethylene, polypropylene, polystyrene, polyimides, polyvinyl alcohols, polyvinyl chloride, fluorine-containing resins such as polyfluoroethylene, nylon and cellulose. The thickness of the base film is 20 to 100 $\mu$m, for example.

(2) Conductive Paste Layer

The conductive paste layer constituting the transfer film can be formed by coating the base film with a conductive paste composition, which comprises conductive particles, a crosslinkable binder resin and/or a crosslinking agent and a solvent as essential ingredients, and drying the coating film to remove part or all of the solvent.

(3) Conductive Paste Composition

The conductive paste composition used to form the transfer film is a paste composition containing (a) conductive particles, (b) a crosslinkable binder resin and (c) a solvent.

(a) conductive particles

The conductive particles used in an electrode-forming material are selected from metal powder such as Ag, Au, Cu, Cr, Ni, Al, Ag—Pd alloy, Ag—Zn alloy, Au—Si alloy, Al—Zn alloy, Al—Si alloy and Ag—Sn alloy, metal compound powder thereof, and carbon powder such as carbon black and graphite.

(b) crosslinkable binder resin

The crosslinkable binder resin used in the conductive paste composition of the present invention may be selected from various resins. Among the various resins, crosslinkable alkali-soluble resins and/or binder resins comprising an alkali-soluble resin and a crosslinking agent are particularly preferred.

The term "crosslinkable" as used herein means a property that a crosslinkable alkali-soluble resin or an alkali-soluble resin and a crosslinking agent, which are contained in the conductive paste pattern after etching, cause a chemical reaction through excitation by heat or by the illumination of radiation having a wavelength range from visible light to X rays, such as electromagnetic waves, electron beams or ion beams, to form a 3-dimensional crosslinking structure and become insoluble in a solvent. They may be excited by the illumination of a plurality of radiation beams. The term "alkali-soluble" as used herein means the property that the resin has such solubility in an alkaline etching solution to be described later that etching of interest is carried out.

Illustrative examples of the crosslinkable alkali-soluble resin or the alkali-soluble resin include (meth)acrylic resins, hydroxystyrene resins, novolak resins, polyester resins and polyamic acid.

Of the above crosslinkable alkali-soluble resins, copolymers of the following monomers (a) and (b) and copolymers of the following monomers (a), (b) and (c) are particularly preferred.

Of the above alkali-soluble resins, copolymers of the following monomers (a) and (c) are particularly preferred.

These crosslinkable alkali-soluble resins or the alkali-soluble resins may be used alone or in combination of two or more.

Monomers (a):

carboxyl group-containing monomers such as acrylic acid, methacrylic acid, maleic acid, fumaric acid, crotonic acid, itaconic acid, citraconic acid, mesaconic acid, cinnamic acid, o-vinylbenzoic acid, m-vinylbenzoic acid, p-vinylbenzoic acid, 1,4-cyclohexenedicarboxylic acid, 3-vinylphthalic acid, 4-vinylphthalic acid, methyl-5-norbornene-2,3-dicarboxylic acid, 3,4,5,6-tetrahydrophthalic acid, 1,2,3,6-tetrahydrophthalic acid and dimethyltetrahydrophthalic acid; hydroxyl group-containing monomers such as 2-hydroxyethyl (meth)acrylate, 2-hydroxypropyl (meth)acrylate and 3-hydroxypropyl (meth) acrylate; phenolic hydroxyl group-containing monomelrs such as o-hydroxystyrene, m-hydroxystyrene and p-hydroxystyrene.

Monomers (b):

epoxy group-containing radical polymerizable compounds such as glycidyl (meth) acrylate, glycidyl α-ethyl (meth) acrylate, glycidyl α-n-propyl (meth)acrylate, glycidyl α-n-butyl (meth)acrylate, 3,4-epoxybutyl (meth) acrylate, 3,4-epoxyheptyl (meth)acrylate, α-ethyl-6,7-epoxyheptyl (meth)acrylate, allylglycidyl ether, vinylglycidyl ether, o-vinylbenzyl glycidyl ether, m-vinylbenzyl glycidyl ether, p-vinylbenzyl glycidyl ether and 3-vinylcyclohexene oxide; and vinyl benzyl ethers such as o-vinylbenzyl methyl ether, m-vinylbenzyl methyl ether, p-vinylbenzyl methyl ether, o-vinylbenzyl ethyl ether, m-vinylbenzyl ethyl ether, p-vinylbenzyl ethyl ether, o-vinylbenzyl propyl ether, m-vinylbenzyl propyl ether, p-vinylbenzyl propyl ether, o-vinylbenzyl isopropyl ether, m-vinylbenzyl isopropyl ether, p-vinylbenzyl isopropyl ether, o-vinylbenzyl butyl ether, m-vinylbenzyl butyl ether, p-vinylbenzyl butyl ether, o-vinylbenzyl isobutyl ether, m-vinylbenzyl isobutyl ether, p-vinylbenzyl isobutyl ether, o-vinylbenzyl-tert-butyl ether, m-vinylbenzyl-tert-butyl ether, p-vinylbenzyl-tert-butyl ether, α-methyl-o-vinylbenzyl methyl ether, α-methyl-m-vinylbenzyl methyl ether, α-methyl-p-vinylbenzyl methyl ether, 2,3-dimethoxymethyl styrene, 2,4-dimethoxymethyl styrene, 2,5-dimethoxymethyl styrene, 2,6-dimethoxymethyl styrene, 2,3,4-trimethoxymethyl styrene, 2,3,5-trimethoxymethyl styrene, 2,3,6-trimethoxymethyl styrene, 3,4,5-trimethoxymethyl styrene and 2,4,6-trimethoxymethyl styrene.

Monomers (c):

styrenes such as styrene, α-methylstyrene, o-methylstyrene, m-methylstyrene, p-methylstyrene, p-methoxystyrene, p-methoxy-α-methylstyrene, p-tert-butoxystyrene and chloromethyl styrene; dienes such as butadiene, 2,3-dimethyl butadiene and isoprene; (meth) acrylates such as methyl (meth)acrylate, ethyl (meth) acrylate, n-propyl (meth)acrylate, i-propyl (meth)acrylate, n-butyl (meth)acrylate, sec-butyl (meth)acrylate, tert-butyl (meth)acrylate, 2-ethylhexyl (meth)acrylate, lauryl (meth) acrylate, dodecyl (meth)acrylate, dicyclopentanyl (meth) acrylate, isobornyl (meth)acrylate, cyclohexyl (meth) acrylate, 2-methylcyclohexyl (meth)acrylate, dicyclohexyl (meth)acrylate, adamantyl (meth)acrylate, allyl (meth) acrylate, propargyl (meth)acrylate, phenyl (meth)acrylate, naphthyl (meth)acrylate, anthracenyl (meth)acrylate, cyclopentyl (meth)acrylate, furyl (meth)acrylate, tetrahydrofuryl (meth)acrylate, pyranyl (meth)acrylate, benzyl (meth) acrylate, phenethyl (meth)acrylate, cresyl (meth)acrylate, 1,1,1-trifluoroethyl (meth)acrylate, perfluoroethyl (meth) acrylate, perfluoro-n-propyl (meth)acrylate, perfluoro-i-propyl (meth)acrylate, triphenylmethyl (meth)acrylate and cumyl (meth)acrylate; (meth)acrylic acid amides such as (meth)acrylic acid amide, (meth)acrylic acid N,N-dimethylamide and (meth)acrylic acid N,N-propylamide; vinyl compounds such as (meth)acrylic acid anilide, (meth) acrylonitrile, acrolein, vinyl chloride, vinylidene chloride, N-vinylpyrrolidone and vinyl acetate; unsaturated dicarboxylic acid diesters such as diethyl maleate, diethlyl fumarate and diethyl itaconate: and macromonomers typified by a macromonomer having a polymerizable unsaturated group such as a (meth)acryloyl group at one terminal of a polymer chain, such as polystyrene, methyl poly(meth) acrylate, ethyl poly(meth)acrylate and benzyl poly(meth)acrylate.

The crosslinking agent which can be used in conjunction with a crosslinkable alkali-soluble resin and/or an alkali-soluble resin is preferably a crosslinkable compound containing two or more ethylenic unsaturated bonds, epoxy groups or (alkoxy)melamine groups in a molecule. The compound may be used in combination with a radical-generating agent, acid-generating agent, basic catalyst, and crosslinking reaction aid or catalyst such as polycarboxylic anhydride according to conditions under which the compound is used.

The crosslinking agent having ethylenic unsaturated double bonds is preferably a polyfunctional (meth)acrylate.

More specifically, bifunctional (meth)acrylates include, for example, Aronix M-210, M-240 and M-6200 (of Toagosei Co., Ltd.), KAYARAD DDDA, HX-220 and R-604 (of NIPPON KAYAKU CO., LTD.) and V260, V312 and V335HP (of Osaka Organic Chemical Industry, Ltd.) (commercial product).

(Meth)acrylates having a functionality of 3 or more include, for example, trimethylol propane triacrylate, pentaerythritol triacrylate, trisacryloyloxyethyl phosphate, pentaerythritol tetraacrylate, dipentaerythritol pentaacrylate, dipentaerythritol and hexaacrylate, as exemplified by such commercial products as Aronix M-309, M-400, M-405, M-450, M-7100, M-8030 and M-8060 (of Toagosei Co., Ltd.), KAYARAD DPHA, TMPTA, DPCA-20, DPCA-30, DPCA-60 and DPCA-120 (of Nippon Kayaku Co., Ltd.), V-295, V-300, V360, V-GPT, V-3PA and V-400 (of Osaka Organic Chemical Industry, Ltd.) and PPZ (of Idemitsu Petrochemical Co., Ltd.).

Of these, polyfunctional (meth)acrylates having a functionality of 3 or more such as Aronix M-400 and KAYARAD DPHA are preferred.

The above crosslinking agents having ethylenic unsaturated double bonds may be used in combination of two or more.

The crosslinking agent having epoxy groups is preferably a polyfunctional glycidyl ether. Illustrative examples of the polyfunctional glycidyl ether include bisphenol A epoxy resins such as Epicoat 1001, 1002, 1003, 1004, 1007, 1009, 1010 and 828 (trade name; Yuka Shell Epoxy Co., Ltd.); bisphenol F epoxy resins such as Epicoat 807 (trade name; Yuka Shell Epoxy Co., Ltd.); phenol novolak epoxy resins such as Epicoat 152 and 154 (trade name; Yuka Shell Epoxy Co., Ltd.) and EPPN201 and 202 (trade name; Nippon Kayaku Co., Ltd.); cresol novolak epoxy resins such as EOCN 102, 103S, 104S, 1020, 1025 and 1027 (trade name; Nippon Kayaku Co., Ltd.) and Epicoat 180S75 (trade name; Yuka Shell Epoxy Co., Ltd.); polyphenol epoxy resins such as Epicoat 1032H60 and XY-4000 (trade name; Yuka Shell Epoxy Co., Ltd.): alicyclic epoxy resins such as CY-175, 177 and 179, and Aldalite CY-182, 192 and 184 (trade name; Ciba-Geigy), ERL-4234, 4299, 4221 and 4206 (trade name; U.C.C. Co., Ltd.), Showdine 509 (trade name; SHOWA DENKO K.K.), Epiclon 200 and 400 (trade name; Dainippon Ink and Chemicals, Inc.), Epicoat 871 and 872 (trade name; Yuka Shell Epoxy Co., Ltd.), and ED-5661 and 5662 (trade name; Celanies Coating Co., Ltd.; and aliphatic polyglycidyl ethers such as Epolite 100MF (Kyoeisha Chemical Co., Ltd.) and Epiol TMP (NOF Corporation).

Illustrative examples of the crosslinking agent having an (alkoxy)melamine structure include hexamethylol melamine, hexabutylol melamine, partly methylolated melamine and alkylated product thereof, tetramethylol benzoguanamine, and partly methylolated benzoguanamine and alkylated product thereof.

The content of the crosslinkable binder resin in the conductive paste composition is generally 1 to 1,000 parts by weight, preferably 1 to 200 parts by weight, based on 100 parts by weight of the above conductive particles.

The content of the crosslinking agent in the crosslinkable binder resin is generally 1 to 1,000 parts by weight, preferably 1 to 200 parts by weight based on 100 parts by weight of the above crosslinkable alkali-soluble resin or of the alkali-soluble resin.

(c) Solvent

The solvent constituting the conductive paste composition is contained to provide appropriate flowability or plasticity and high film-formability to the conductive paste composition.

The solvent constituting the conductive paste composition is not particularly limited but is selected from, for example, ethers, esters, ether esters, ketones, ketone esters, amides, amide esters, lactams, lactones, sulfoxides, sulfones, hydrocarbons and hydrocarbon halides.

The solvent preferably has (1) a standard boiling point (boiling point at 1 atm) of 100 to 200° C., preferably 110 to 180° C., and (2) a vapor pressure at 20° C. of 0.5 to 50 mmHg, preferably 0.7 to 30 mmHg.

When the standard boiling point is higher than 200° C., the boiling point of the whole solvent contained becomes too high. In this case, a blocking phenomenon is liable to occur when the transfer film is kept in the form of a roll, because a considerable amount of an organic solvent remains in the film-forming material layer of the obtained transfer film when the transfer film is produced by coating the conductive paste composition containing the solvent. On the other hand, when the standard boiling point is lower than 100° C., the boiling point of the whole solvent becomes too low. In this case, agglomerates of conductive particles are easily produced in the conductive paste composition containing the solvent, with the result that such film defects as coating stripes, craters and pin holes are often seen in the film-forming material layer formed by coating the composition.

When the vapor pressure is lower than 0.5 mmHg, the vapor pressure of the whole solvent contained becomes too low. In this case, a blocking phenomenon is liable to occur when the transfer film is kept in the form of a roll, because a considerable amount of an organic solvent remains in the film-forming material layer of the obtained transfer film when the transfer film is produced by coating the conductive paste composition containing the solvent. On the other hand, when the vapor pressure is higher than 50 mmHg, the vapor pressure of the whole solvent becomes too high. In this case, the conductive paste composition containing the solvent has quick dry properties and poor leveling properties at the time of coating, with the result that film-thickness uniformity easily deteriorates.

Illustrative examples of the solvent include tetrahydrofuran, anisole, dioxane, ethylene glycol monoalkyl ethers, diethylene glycol dialkyl ethers, propylene glycol monoalkyl ethers, propylene glycol dialkyl ethers, acetates, hydroxyacetic acid esters, alkoxyacetic acid esters, propionates, hydroxypropionic acid esters, alkoxypropionic acid esters, lactates, ethylene glycol monoalkyl ether acetates, propylene glycol monoalkyl ether acetates, cyclic ketones, noncyclic ketones, acetoacetic acid esters, pyruvates, N,N-dialkylformamides, N,N-dialkylacetoamides, N-alkylpyrrolidones, γ-lactones, dialkyl sulfoxides, dialkyl sulfones, terpineol and N-methyl-2-pyrrolidone. They may be used alone or in combination of two or more.

The content of the solvent in the conductive paste composition is suitably selected from a range within which high film-formability (flowability or plasticity) can be obtained.

The conductive paste composition may contain such additives as a plasticizer, development accelerator, adhesive aid, halation-preventing agent, storage stabilizer, defoaming agent, antioxidant, ultraviolet absorber, filler and low-melting glass as optional components.

The conductive paste composition may contain fatty acid as a dispersant for conductive particles. Preferred examples of the fatty acid include saturated fatty acids such as octanoic acid, undecylic acid, lauric acid, myristic acid, palmitic acid, pentadecanoic acid, stearic acid and arachic acid; and unsaturated fatty acids such as elaidic acid, oleic acid, linoleic acid, linolenic acid and arachidonic acid. They may be used alone or in combination of two or more. The content of the fatty acid in the conductive paste composition is preferably 10 parts or less by weight, based on 100 parts by weight of the conductive particles.

Means of coating the conductive paste composition on the base film must be able to form a coating film having excellent uniformity in film thickness and a large thickness (for example, 1 μm or more) efficiently, as preferably exemplified by coating with a roll coater, doctor blade, curtain coater, wire coater or slit die.

The surface of the base film to be coated with the conductive paste composition is preferably subjected to a release treatment. Thereby, the operation of removing the base film in the transfer step, which will be described later, can be performed easily.

As for conditions for drying the coating film, it is dried at 50 to 150° C. for 0.5 to 30 minutes. The residual rate of the solvent after drying (content of the solvent in the conductive paste layer) is generally 2 wt % or less.

The thickness of the conductive paste layer formed on the base film as described above, though different according to the content of the conductive particles and the type and size of the material, is 1 to 100 μm, for example.

The protective film layer which may be formed on the surface of the conductive paste layer is, for example, a polyethylene film and polyvinyl alcohol film.

Resist Film (resist composition)

In the formation process of the present invention, the resist film is formed on the conductive paste layer, exposed and developed to form a resist pattern on the conductive paste layer.

The resist composition used to form the resist film is, for example, (1) an alkali development radiation sensitive resist composition, (2) an organic solvent development radiation sensitive resist composition, or (3) an aqueous development radiation sensitive resist composition. These resist compositions will be described hereinafter.

(1) Alkali Development Radiation Sensitive Resist Composition

The alkali development radiation sensitive resist composition contains an alkali soluble resin and a radiation sensitive component as essential ingredients.

Examples of the alkali soluble resin constituting the alkali-development radiation sensitive resist composition are the same as those listed for the alkali soluble resin constituting the binder component of the conductive paste composition.

The radiation sensitive component constituting the alkali development radiation sensitive resist composition is, for example, (1) combinations of a polyfunctional monomer and a photopolymerization initiator, (2) combinations of a melamine resin and an optical acid generator that forms acid upon exposure to radiation, and (3) a compound which is originally hardly alkali-soluble but becomes alkali-soluble upon exposure to radiation. A negative-type combination of a polyfunctional (meth)acrylate and a photopolymerization initiator out of the combinations (1) and a positive-type compound (3) are particularly preferred.

Illustrative examples of the polyfunctional (meth)acrylate constituting the negative-type radiation sensitive component include di(meth)acrylates of alkylene glycol such as ethylene glycol and propylene glycol; di(meth)acrylates of polyalkylene glycol such as polyethylene glycol and polypropylene glycol; di(meth)acrylates of polymers having hydroxyl groups at both terminals such as both-terminal hydroxypolybutadiene, both-terminal hydroxypolyisoprene and both-terminal hydroxypolycaprolactone; poly(meth)acrylates of polyhydric alcohols having a valence of 3 or more such as glycerin, 1,2,4-butanetriol, trimethylol alkane, tetramethylol alkane and dipentaerythritol; poly(meth)acrylates of adducts of polyhydric alcohols having a valence of 3 or more with polyalkylene glycol; poly(meth)acrylates of cyclic polyols such as 1,4-cyclohexanediol and 1,4-benzenediol; and oligo(meth)acrylates such as polyester (meth)acrylate, epoxy (meth)acrylate, urethane (meth)acrylate, alkyd resin (meth)acrylate, silicone resin (meth)acrylate and spiran resin (meth)acrylate.

Illustrative examples of the photopolymerization initiator constituting the negative-type radiation sensitive component include carbonyl compounds such as benzyl, benzoin, benzophenone, camphorquinone, 2-hydroxy-2-methyl-1-phenylpropan-1-one, 1-hydroxycyclohexylphenyl ketone, 2,2-dimethoxy-2-phenylacetophenone, 2-methyl-[4'-(methylthio)phenyl]-2-morpholino-1-propanone and 2-benzyl-2-dimethylamino-1-(4-morpholinophenyl)-butan-1-one; azo compounds and azido compounds such as azoisobutyronitrile and 4-azidobenzaldehyde; organic sulfur compounds such as mercaptan disulfide; organic peroxides such as benzoyl peroxide, di-tert-butyl peroxide, tert-butyl hydroperoxide, cumene hydroperoxide and paramethane hydroperoxide; trihalomethanes such as 1,3-bis(trichloromethyl)-5-(2'-chlorophenyl)-1,3,5-triazine and 2-[2-(2-furanyl)ethylenyl]-4,6-bis(trichloromethyl)-1,3,5-triazine; and imidazole dimers such as 2,2'-bis(2-chlorophenyl)4,5,4',5'-tetraphenyl-1,2'-blimidazole. They may be used alone or in combination of two or more.

Illustrative examples of the positive-type radiation sensitive compound include 1,2-benzoquinonediazido-4-sulfonic acid esters, 1,2-naphthoquinonediazido-4-sulfonic acid esters, 1,2-naphthoquinonediazido-5-sulfonic acid esters and 1,2-naphthoquinonediazido-6-sulfonic acid esters of polyhydroxy compounds. Of these, 1,2-naphthoquinonediazido-4-sulfonic acid esters and 1,2-naphthoquinonediazido-5-sulfonic acid esters of polyhydroxy compounds are particularly preferred.

The radiation sensitive compound can be obtained, for example, by reacting a polyhydroxy compound with quinonediazidosulfonyl chloride in the presence of a basic catalyst. The ratio (average esterification rate) of the quinonediazidosulfonic acid ester to all the hydroxyl groups of the polyhydroxy compound is generally 20% to 100%, preferably 40 to 95%. If the average esterification rate is too low, a pattern is difficult to form, while if it is too high, sensitivity may lower.

The polyhydroxy compound used herein is not particularly limited but is exemplified by the following compounds.

wherein $X_1$ to $X_{15}$ are the same or different and each a hydrogen atom, an alkyl group having 1 to 4 carbon atoms, an alkoxy group having 1 to 4 carbon atoms, an aryl group having 6 to 10 carbon atoms or a hydroxyl group, with the proviso that at least one of $X_1$ to $X_5$ and at least one of $X_6$ to $X_{10}$ are a hydroxyl group, and $Y_1$ is a hydrogen atom or an alkyl group having 1 to 4 carbon atoms.

wherein $X_{16}$ to $X_{30}$ are the same as $X_1$ to $X_{15}$, with the proviso that at least one of $X_{16}$ to $X_{20}$, at least one of $X_{21}$ to $X_{25}$ and at least one of $X_{26}$ to $X_{30}$ are a hydroxyl group, and $Y_2$ to $Y_4$ are the same or different and each a hydrogen atom or an alkyl group having 1 to 4 carbon atoms.

wherein $X_{31}$ to $X_{44}$ are the same as $X_1$ to $X_{15}$, with the proviso that at least one of $X_{31}$ to $X_{35}$ is a hydroxyl group, and $Y_5$ to $Y_8$ are the same or different and each a hydrogen atom or an alkyl group having 1 to 4 carbon atoms.

wherein $X_{45}$ to $X_{58}$ are the same or different and each a hydrogen atom, a halogen atom, an alkyl group having 1 to 4 carbon atoms, an alkoxy group having 1 to 4 carbon atoms, a cycloalkyl group having 5 to 7 carbon atoms or a hydroxyl group, with the proviso that at least one of $X_{45}$ to $X_{48}$ and at least one of $X_{49}$ to $X_{53}$ are a hydroxyl group, and $Y_9$ and $Y_{10}$ are the same or different and each a hydrogen atom, an alkyl group having 1 to 4 carbon atoms or a cycloalkyl group having 5 to 7 carbon atoms.

wherein $X_{59}$ to $X_{80}$ are the same as $X_{45}$ to $X_{58}$, with the proviso that at least one of $X_{59}$ to $X_{63}$, at least one of $X_{64}$ to $X_{67}$, at least one of $X_{72}$ to $X_{75}$ and at least one of $X_{76}$ to $X_{80}$ are a hydroxyl group, and $Y_{11}$ to $Y_{18}$ are the same or different and each a hydrogen atom or an alkyl group having 1 to 4 carbon atoms.

wherein $X_{81}$ to $X_{90}$ are the same or different and each a hydrogen atom, an alkoxy group having 1 to 4 carbon atoms, an aryl group having 6 to 10 carbon atoms or a hydroxyl group, with the proviso that at least one of $X_{81}$ to $X_{90}$ is a hydroxyl group.

The content of the radiation sensitive component in this alkali development radiation sensitive resist composition is generally 1 to 200 parts by weight, preferably 5 to 100 parts by weight, based on 100 parts by weight of the alkali-soluble resin.

An organic solvent is properly contained in the alkali development radiation sensitive resist composition to provide high film formability. Examples of the organic solvent are the same as those listed for the solvent constituting the conductive paste composition.

(2) Organic Solvent Development Radiation Sensitive Resist Composition:

The organic solvent development radiation sensitive resist composition contains at least one selected from natural rubber, synthetic rubber and cyclized rubber obtained by cyclizing these and an azido compound as essential ingredients.

Illustrative examples of the azido compound constituting the organic solvent development radiation sensitive resist composition include 4,4'-diazidobenzophenone, 4,4'-diazidodiphenylmethane, 4,4'-diazidostilbene, 4,4'-diazidocalchone, 4,4'-diazidobenzalacetone, 2,6-di(4'-azidobenzal)cyclohexanone and 2,6-di(4'-azidobenzal)-4-methylcyclohexanone. They may be used alone or in combination of two or more.

The organic solvent development radiation sensitive resist composition generally contains an organic solvent to provide high film formability. Examples of the organic solvent are the same as those listed for the solvent constituting the conductive paste composition.

(3) Aqueous Development Radiation Sensitive Resist Composition:

The aqueous development radiation sensitive resist composition contains a water-soluble resin such as polyvinyl alcohol and at least one selected from diazonium compounds and bichromic acid compounds as essential ingredients.

The resist composition used in the formation process of the present invention may contain such additives as a development accelerator, adhesive aid, halation-preventing agent, storage stabilizer, defoaming agent, antioxidant, ultraviolet absorber, filler, phosphor, pigment and dye as optional components.

Exposure Mask

The exposure pattern of the exposure mask M used in the step of exposing the resist film, though different according to each material, is generally a 10 to 500-$\mu$m-wide stripe pattern.

Developing Solution

The developing solution used in the step of developing the resist film can be properly selected according to the type of the resist film (resist composition). Stated more specifically, an alkali developing solution can be used for a resist film formed from an alkali development radiation sensitive resist composition, an organic solvent development solution can be used for a resist film formed from an organic solvent development radiation sensitive resist composition, and an aqueous developing solution can be used for a resist film formed from an aqueous development radiation sensitive resist composition.

The effective ingredient of the alkali developing solution is, for example, an inorganic alkaline compound such as lithium hydroxide, sodium hydroxide, potassium hydroxide, sodium hydrogenphosphate, diammonium hydrogenphosphate, dipotassium hydrogenphosphate, disodium hydrogenphosphate, ammonium dihydrogenphosphate, potassium dihydrogenphosphate, sodium dihydrogenphosphate, lithium silicate, sodium silicate, potassium silicate, lithium carbonate, sodium carbonate, potassium carbonate, lithium borate, sodium borate, potassium borate or ammonia; or an organic alkaline compound such as tetramethyl ammonium hydroxide, trimethyl hydroxyethyl ammonium hydroxide, monomethylamine, dimethylamine, trimethylamine, monoethylamine, diethylamine, triethylamine, monoisopropylamine, diisopropylamine or ethanolamine.

The alkali developing solution used in the step of developing the resist film can be prepared by dissolving one or more of the above alkaline compounds in water. The concentration of the alkaline compound in the alkaline developing solution is generally 0.001 to 10 wt %, preferably 0.01 to 5 wt %. After the resist film is developed with the alkaline developing solution, it is generally washed with water.

Illustrative examples of the organic solvent development solution include organic solvents such as toluene, xylene and butyl acetate. They may be used alone or in combination of two or more. After the resist film is developed with the organic solvent development solution, it is rinsed with a poor solvent as required.

Illustrative examples of the aqueous developing solution include water and alcohols.

Etching Solution

The etching solution used in the step of etching the conductive paste layer is preferably an alkaline solution. Thereby, the alkali-soluble resin contained in the conductive paste layer can be dissolved and removed.

Since the conductive particles contained in the conductive paste layer are uniformly dispersed in the alkali-soluble resin, they are removed at the same time when the alkali-soluble resin as a binder is dissolved in an alkaline solution and washed.

The alkaline solution used as the etching solution has the same composition as that of the developing solution.

When the etching solution is the same as the alkali developing solution used in the development step, the development step and the etching step can be carried out in succession, whereby the formation process is simplified to improve production efficiency.

After the resist film is etched with the alkaline solution, it is generally washed with water.

An organic solvent that can dissolve the binder of the conductive paste layer can also be used as the etching solution. Examples of the organic solvent are the same as those listed for the solvent constituting the conductive paste composition.

After the resist film is etched with the organic solvent, it is rinsed with a poor solvent as required.

EXAMPLES

The following examples are provided for the purpose of further illustrating the present invention but are in no way to be taken as limiting. In the following examples, "parts" and "%" mean "parts by weight" and "wt %", respectively.

The weight average molecular weight (Mw) is an average molecular weight, in terms of polystyrene, measured by a gel permeation chromatography (GPC) (trade name: HLC-802A) of TOSO CORPORATION.

Synthesis Example 1

To a separable flask equipped with a stirrer, cooling pipe, nitrogen introduction pipe and thermometer were charged 20 g of methacrylic acid, 40 g of glycidyl methacrylate, 30 g of dicyclopentanyl methacrylate, 10 g of styrene, 3.0 g of 2,2'-azobis(2,4-dimethylvaleronitrile) and 60 g of diethylene glycol methyl ethyl ether. After the content of the flask was purged with nitrogen for 30 minutes, the flask was immersed in an oil bath to carry out a polymerization reaction for 6 hours with the inside temperature kept at 70° C. The solid content of the polymer solution was 61.0%. The copolymer [A] had a weight average molecular weight (Mw) of $1.88 \times 10^4$.

Synthesis Example 2

A polymer solution was obtained in the same manner as in Synthesis Example 1 except that a monomer composition comprising 200 parts of ethyl 3-ethoxypropionate, 85 parts of n-butyl methacrylate, 15 parts of methacrylic acid and 1 part of azobisisobutyronitrile was charged into an autoclave. The polymerization rate was 98% and the copolymer separated out from this polymer solution [to be referred to as "polymer B' hereinafter] had a weight average molecular weight of 50,000.

Synthesis Example 3 (synthesis of PAC-1)

After 4.28 g (0.01 mol) of a compound represented by the following formula (β) was dissolved in 30 g of tetrahydrofuran, 2.8 g (0.028 mol) of triethylamine was added to the resulting solution. While the solution was cooled to 0 to 5° C., 7.11 g (0.025 mol) of 1,2-naphthoqulnonediazido-5-sulfonyl chloride was added to the solution over 30 minutes. After 5 hours, the deposited triethylamine hydrochloride was filtered, precipitated in 2,000 ml of a 0.2% aqueous solution of hydrochloric acid diluted with deionized water again, filtered, washed with water three times, and vacuum-dried at 40° C. to give 9.2 g of a condensation compound. This compound was taken as PAC-1 (PAC; Photo Acid Compound).

(a)

Preparation Example 1

There were kneaded together 750 parts of silver powder as conductive particles, 150 parts of the polymer (A) as an alkali-soluble resin, 20 parts of polypropylene glycol [molecular weight of 400, manufactured by Wako Pure Chemical Industries, Ltd.] as a plasticizer and 400 parts of N-methyl-2-pyrrolidone as a solvent to prepare a conducive paste composition for forming an electrode [to be referred to as "conductive paste composition (1)" hereinafter].

Then, the obtained conductive paste composition (1) was coated on a polyethylene terephthalate (PET) base film (200 mm in width, 30 m in length and 38 μm in thickness), which had been subjected to a release treatment, with a roll coater. The formed coating film was dried at 100° C. for 5 minutes to remove the solvent. Thus, a transfer film [to be referred to as "transfer film (1)" hereinafter] was prepared that has a 20-μm-thick conductive paste layer for forming an electrode [to be referred to as "conductive paste layer (1)" hereinafter] formed on the base film.

Preparation Example 2

There were kneaded together 50 parts of the polymer (B) as an alkali-soluble resin, 40 parts of pentaerythritol tetraacrylate as a polyfunctional monomer (radiation sensitive component), 5 parts of 2-benzyl-2-dimethylamino-1-(4-morpholinophenyl)-butan-1-one as a photopolymerization initiator (radiation sensitive component) and 150 parts of ethyl 3-ethoxypropionate as a solvent to prepare a negative-type alkali development radiation sensitive resist paste composition (1).

Then, the obtained resist composition was coated on a polyethylene terephthalate (PET) base film (200 mm in width, 30 m in length and 38 μm in thickness) with a roll coater to form a coating film. The formed coating film was dried at 110° C. for 5 minutes to remove the solvent completely. Thus, there was prepared a transfer film [to be referred to as "transfer film (2)" hereinafter] having a 5-μm-thick resist film [to be referred to as "resist film (1)" hereinafter] formed on the base film.

Preparation Example 3

There were kneaded together 50 parts of the polymer (B) as an alkali-soluble resin, 10 parts of PAC-1 as a photosensitive agent (radiation sensitive component) and 150 parts of ethyl 3-ethoxypropionate as a solvent to prepare a positive-type alkali development radiation sensitive resist paste composition (2).

Thereafter, the obtained resist composition was coated on a polyethylene terephthalate (PET) base film (200 mm in width, 30 m in length and 38 μm in thickness) with a roll coater to form a coating film. The formed coating film was dried at 100° C. for 5 minutes to remove the solvent completely. Thus, there was prepared a transfer film [to be referred to as "transfer film (3)" hereinafter] having a 5-μm-thick resist film [to be referred to as "resist film (2)" hereinafter] formed on the base film.

Example 1

(step of transferring conductive paste layer)

The transfer film (1) was placed upon a 10-cm-square alumina substrate in such a manner that the conductive paste layer (1) for forming an electrode came into contact with the surface of the alumina substrate. The transfer film (1) was thermally press-bonded to the alumina substrate with a heating roller. Press-bonding conditions include a heating roller surface temperature of 120° C., a roll pressure of 4 kg/cm$^2$ and a heating roller moving speed of 0.5 m/min. After press-bonding, the base film was separated and removed from the conductive paste layer (1). Thereby, the conductive paste layer (1) was transferred and closely adhered to the surface of the alumina substrate. The thickness of the conductive paste layer was measured and found to be 20 μm±1 μm.

(step of forming resist film)

The transfer film (2) was placed upon the conductive paste layer (1) in such a manner that the surface of the resist film (1) came into contact with the surface of the conductive paste layer (1). The transfer film (2) was press-bonded to the conductive paste layer under the same conditions as the above conditions of the heating roller. After press-bonding, the base film was separated and removed from the resist film (1). Thereby, the resist film (1) was transferred and closely adhered to the surface of the conductive paste layer (1).

The thickness of the resist film (1) transferred onto the surface of the conductive paste layer (1) was measured and found to be 5 μm±1 μm.

(step of exposing resist film)

The resist film (1), formed on the laminate comprising the conductive paste layer, was exposed to i-rays (ultraviolet radiation having a wavelength of 365 nm) by an ultra high-pressure mercury lamp through an exposure mask (having 40-μm-wide stripe pattern). The amount of exposure was 400 mJ/cm$^2$.

(step of developing resist film)

The exposed resist film (1) was developed for 30 seconds with a shower of a 0.1 wt % aqueous solution of potassium hydroxide (25° C.) as a developing solution. Then, the resist film was washed with ultra-pure water to remove uncured resist which had not been exposed to ultraviolet radiation, whereby a resist pattern was formed.

(step of etching conductive paste layer)

Subsequently to the above step, the conductive paste layer was etched for 3 minutes with a shower of a 0.1 wt % aqueous solution of potassium hydroxide (25° C.) as an etching solution.

Then, washing with ultra-pure water and drying were carried out. Thereby, a conductive paste layer pattern consisting of material layer residual portions and material layer removed portions was formed.

(step of thermosetting conductive paste layer)

The alumina substrate having the conductive paste layer pattern formed thereon was thermoset in a firing furnace at an ambient temperature of 300° C. for 20 minutes. Thereby, an electrode material having electrode wires formed on the alumina substrate was obtained.

The section of each electrode in the obtained electrode material was observed through a scanning electron microscope to measure the width and height of the bottom of the section, which were 40 μm±2 μm and 8 μm±1 μm, respectively. Thus, the dimensional accuracy was extremely high.

Example 2

Electrode wires were formed on an alumina substrate in the same manner as in Example 1 except that the transfer film (3) was used in place of the transfer film (2).

The section of each electrode in the obtained electrode material was observed through a scanning electron microscope to measure the width and height of the bottom of the section, which were 40 μm±2 μm and 8 μm±1 μm, respectively. Thus, the dimensional accuracy was extremely high.

Example 3

[Formation of Transfer Film]

A transfer film (4), having a laminate layer consisting of a conductive paste layer and a resist film formed on a base film, was prepared by the following operations (1) and (2).

(1) The positive-type alkali development radiation sensitive resist composition (1) used in Example 1 was coated on a PET base film (200 mm in width, 30 m in length and 38 µm in thickness) with a roll coater, the obtained coating film was dried at 100° C. for 5 minutes to remove the solvent completely, and a 5-µm-thick resist film [to be referred to as "resist film (1')" hereinafter] was thereby formed on the base film.

(2) The conductive paste composition (1) used in Example 1 was coated on the resist film (1') with a roll coater, the coating film was dried at 100° C. for 5 minutes to remove the solvent completely, and a 20-µm-thick conductive paste layer [to be referred to as "conductive paste layer (1')" hereinafter] was thereby formed on the resist film (1').

(step of transferring laminate film)

The transfer film was placed upon an alumina substrate, which was the same as that used in Example 1, in such a manner that the surface of the conductive paste layer (1') came into contact with the alumina substrate. The transfer film was thermally press-bonded to the substrate with a heating roller. Press-bonding conditions include a heating roller surface temperature of 120° C., a roll pressure of 4 kg/cm² and a heating roller moving speed of 0.5 m/min. After press-bonding, the base film was separated and removed from the laminate film [surface of the resist film (1')]. Thereby, the laminate film was transferred and closely adhered to the surface of the alumina substrate. The thickness of this laminate film [laminate film consisting of the conductive paste layer and the resist film] was measured and found to be 25 µm±2 µm.

(step of exposing and developing resist film)

The resist film (1') formed on the laminate comprising the conductive paste layer was exposed to ultraviolet radiation, developed with an aqueous solution of potassium hydroxide and washed with water under the same conditions as those of Example 1 to form a resist pattern on the laminate comprising the conductive paste layer.

(step of etching conductive paste layer)

Subsequently to the above step, the conductive paste layer was etched with an aqueous solution of potassium hydroxide, washed with water and dried under the same conditions as those of Example 1 to form a conductive paste layer pattern.

(step of thermosetting conductive paste layer)

The alumina substrate having the conductive paste layer pattern formed thereon was baked in a firing furnace at an ambient temperature of 300° C. for 20 minutes. Thereby, an electrode material having electrode wires formed on the alumina substrate was obtained.

The section of each electrode in the obtained electrode material was observed through a scanning electron microscope to measure the width and height of the bottom of the section, which were 40 µm±2 µm and 8 µm±1 µm, respectively. Thus, the dimensional accuracy was extremely high.

According to the electrode formation process of the present invention, the number of steps is substantially smaller than that of the prior art, thereby making it possible to form electrodes with improved workability.

Further, according to the electrode formation process of the present invention, it is possible to form a finer pattern than that of the prior art.

What is claimed is:

1. A process for the preparation of an electrode, which comprises:
    (1) transferring a conductive paste layer comprising a crosslinkable binder resin supported on a base film to a substrate to form the conductive paste layer on the substrate;
    (2) forming a resist film on the conductive paste layer transferred to the substrate;
    (3) exposing the resist film through a mask to form a resist pattern latent image;
    (4) developing the exposed resist film to form a resist pattern;
    (5) etching exposed portions of the conductive paste layer to form a conductive paste layer pattern corresponding to the resist pattern; and
    (6) thermosetting the pattern to thermally crosslink the crosslinkable binder resin and form a conductive layer pattern.

2. The process of claim 1 for forming an electrode on a substrate, wherein the conductive paste layer is a paste layer in which conductive particles are dispersed.

3. The process of claim 1, wherein the conductive paste layer is formed by coating a paste composition, comprising (a-1) conductive particles, (b) a crosslinkable alkali-soluble resin and (c) a solvent, on the base film and drying the coating film to remove part or all of the solvent.

4. The process of claim 1, wherein the formation of the resist film in the step (2) carried out by transferring the resist film supported on the base film to the conductive paste layer.

5. The process of claim 1, wherein the conductive paste layer formed on the substrate in the step (1) is a laminated paste layer consisting of a plurality of layers.

6. The process of claim 1, wherein a single conductive paste layer supported on a base film is transferred 2 to 10 times to form a laminated paste layer consisting of 2 to 10 layers in the step (1).

7. The process of claim 1, wherein a laminated conductive paste layer consisting of 2 to 10 layers supported on a base film is transferred to the substrate to form a laminated conductive paste layer consisting of 2 to 10 layers on the substrate in the step (1).

8. A process for forming an electrode, which comprises:
    (1) transferring a laminate film, which has a resist film and a conductive paste layer comprising a crosslinkable binder resin laminated on a base film in the order of mention, to a substrate to form the laminate film consisting of the conductive paste layer comprising a crosslinkable binder resin and the resist film on the substrate in this order;
    (2) exposing the resist film through a mask to form a resist pattern latent image;
    (3) developing the exposed resist film to form a resist pattern;
    (4) etching exposed portions of the conductive paste layer to form a conductive paste layer pattern corresponding to the resist pattern; and
    (5) thermosetting the pattern to thermally crosslink the crosslinkable binder resin and form a conductive layer pattern.

9. The process of claim 8 for forming an electrode on a substrate, wherein the conductive paste layer is a paste layer in which conductive particles are dispersed.

10. The process of claim 8, wherein the conductive paste layer is formed by coating a paste composition comprising (a-1) conductive particles, (b) a crosslinkable alkali-soluble resin and (c) a solvent on the resist film of a base film having the resist film and drying the coating film to remove part or all of the solvent.

11. The process of claim 8, wherein the resist film in the step (1) is formed by transferring a resist film supported on a base film to another base film.

12. The process of claim 8, wherein the conductive paste layer of the laminate formed on the substrate in the step (1) is a laminated paste layer consisting of a plurality of layers.

13. The process of claim 8, wherein the laminate in the step (1) is formed by transferring a single conductive paste layer supported on a base film 2 to 10 times to form a laminated paste layer consisting of 2 to 10 layers on the resist film of another base film having the resist film.

14. The process of claim 8, wherein the laminate in the step (1) is formed by transferring a laminated conductive paste layer consisting of 2 to 10 layers supported on a base film to the resist film of another base film having the resist film to form the laminated conductive paste layer consisting of 2 to 10 layers on the base film.

* * * * *